(12) United States Patent
Lee et al.

(10) Patent No.: US 8,858,286 B2
(45) Date of Patent: Oct. 14, 2014

(54) ORGANIC ELECTROLUMINESCENT DISPLAY DEVICE AND METHOD OF FABRICATING THE SAME

(75) Inventors: Jong Moo Lee, Seoul (KR); Hyun Ju Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/904,017

(22) Filed: Oct. 13, 2010

(65) Prior Publication Data

US 2011/0101853 A1  May 5, 2011

(30) Foreign Application Priority Data

Oct. 30, 2009  (KR) .................. 10-2009-0104368

(51) Int. Cl.
*H01J 9/00* (2006.01)
*H01J 9/24* (2006.01)
*H01L 51/56* (2006.01)
*H01L 51/52* (2006.01)

(52) U.S. Cl.
CPC ........... *H01L 51/56* (2013.01); *H01L 2251/566* (2013.01); *H01L 51/5237* (2013.01)
USPC .............. 445/24; 445/23; 445/25; 313/504; 313/512

(58) Field of Classification Search
USPC ................. 313/504, 512; 445/24, 25
See application file for complete search history.

(56) References Cited

U.S. PATENT DOCUMENTS

| | | | |
|---|---|---|---|
| 4,792,723 A * | 12/1988 | Igarashi et al. ............... 313/503 |
| 6,355,125 B1 * | 3/2002 | Tahon et al. .................... 156/99 |
| 6,580,094 B1 * | 6/2003 | Yamazaki et al. .............. 257/79 |
| 6,758,713 B2 * | 7/2004 | Wei et al. ........................ 445/24 |
| 6,896,572 B2 * | 5/2005 | Park et al. ....................... 445/25 |
| 6,936,131 B2 * | 8/2005 | McCormick et al. ......... 156/292 |
| 6,943,052 B2 * | 9/2005 | Kamiyama et al. ............ 438/59 |
| 7,485,547 B2 | 2/2009 | Yamamura et al. |
| 7,545,094 B2 * | 6/2009 | Choi et al. .................... 313/504 |
| 7,548,023 B2 * | 6/2009 | Yamazaki et al. ............ 313/512 |
| 7,708,614 B2 * | 5/2010 | Harada ........................... 445/25 |
| 8,030,844 B2 * | 10/2011 | Shin et al. ..................... 313/511 |
| 2002/0068143 A1 * | 6/2002 | Silvernail et al. .............. 428/76 |
| 2003/0064540 A1 * | 4/2003 | Auch et al. ...................... 438/99 |
| 2003/0143423 A1 * | 7/2003 | McCormick et al. ......... 428/690 |

(Continued)

FOREIGN PATENT DOCUMENTS

| | | |
|---|---|---|
| CN | 1947240 A | 4/2007 |
| CN | 1973579 A | 5/2007 |

OTHER PUBLICATIONS

Chinese Office Action for Chinese Patent Application No. 201010509835.1, dated Jul. 30, 2012. (With English Translation).

*Primary Examiner* — Thomas A Hollweg
(74) *Attorney, Agent, or Firm* — Birch, Stewart, Kolasch & Birch, LLP

(57) ABSTRACT

A method for fabricating an organic electroluminescent display device includes: forming a switching thin film transistor, a driving thin film transistor and an organic electroluminescent diode on a mother substrate having a plurality of unit cell areas; forming a cutting portion in a metal foil having a plurality of unit metal foil areas, the metal foil having a size corresponding to the mother substrate; forming an adhesive layer on the metal foil; attaching the mother substrate and the metal foil such that the adhesive layer contacts the mother substrate; and cutting the mother substrate and the metal foil along the cutting portion.

6 Claims, 13 Drawing Sheets

(56) References Cited

U.S. PATENT DOCUMENTS

| | | | |
|---|---|---|---|
| 2003/0218422 A1* | 11/2003 | Park et al. ............... 313/512 |
| 2004/0141145 A1* | 7/2004 | Tatemura et al. ......... 349/200 |
| 2005/0129841 A1* | 6/2005 | McCormick et al. ...... 427/66 |
| 2005/0184662 A1 | 8/2005 | Cok et al. |
| 2006/0135029 A1* | 6/2006 | Harada .................... 445/25 |
| 2007/0007893 A1* | 1/2007 | Shin et al. ............... 313/512 |
| 2007/0090759 A1* | 4/2007 | Choi et al. ............... 313/512 |
| 2007/0170605 A1* | 7/2007 | Lee et al. ................. 264/1.1 |
| 2007/0170839 A1* | 7/2007 | Choi et al. ............... 313/500 |
| 2007/0176185 A1* | 8/2007 | Lee et al. ................. 257/79 |
| 2007/0196949 A1* | 8/2007 | Lee ......................... 438/99 |
| 2008/0003720 A1 | 1/2008 | Lu et al. |
| 2008/0050585 A1 | 2/2008 | Masuda et al. |
| 2008/0238302 A1* | 10/2008 | Sung et al. ............... 313/504 |
| 2008/0268738 A1* | 10/2008 | Kanai et al. ............. 445/24 |
| 2009/0267507 A1* | 10/2009 | Takashima et al. ....... 313/511 |

* cited by examiner

ORGANIC ELECTROLUMINESCENT DISPLAY DEVICE AND METHOD OF FABRICATING THE SAME

The present application claims the benefit of Korean Patent Application No. 10-2009-0104368 filed in Korea on Oct. 30, 2009, which is hereby incorporated by reference in its entirety.

BACKGROUND OF THE INVENTION

1. Field of the Invention

The present invention relates to an organic electroluminescent display (ELD) device, and more particularly, to an organic electroluminescent display device including a metal foil for encapsulation and a method of fabricating the same.

2. Discussion of the Related Art

Although cathode ray tube (CRT) devices have been widely used as a display device, flat panel displays (FPDs) such as plasma display panel (PDP) devices, liquid crystal display (LCD) devices and organic electroluminescent display (ELD) devices becomes the subject of recent research.

Among the flat panel displays (FPDs), since the organic ELD devices are an emissive type that does not include a backlight unit required for a non-emissive type such as the LCD devices, the organic ELD devices have a light weight and a thin profile. In addition, the organic ELD devices have advantages such as high viewing angle, high contrast ratio, low power consumption, low direct current (DC) driving voltage and high response speed over the LCD devices. Moreover, since the organic ELD devices include a solid state element of an emitting material layer, the organic ELD devices are resistant to external impact and have a wide range in operation temperature. Specifically, since the organic ELD device have a simple fabrication process, production cost for the organic ELD devices are reduced as compared with the LCD devices.

Organic ELD devices may be classified into a passive matrix type and an active matrix type according to existence of a switching element. In a passive matrix type organic ELD device, a scan line and a signal line that cross each other to define a pixel region are disposed in a matrix without a switching element. In an active matrix type organic ELD device, a scan line and a signal line that cross each other to define a pixel region are disposed in a matrix, and a driving thin film transistor (TFT) as a switching element and a storage capacitor that supplies a voltage to the driving TFT during a frame are disposed in each pixel region.

Recently, since the passive matrix type organic ELD devices have disadvantages in a resolution, a power consumption and a lifetime, the active matrix type organic ELD devices capable of obtaining a high resolution and a large-sized display area have been widely researched.

FIG. 1 is a cross-sectional view showing an organic electroluminescent display device of a bottom emission type according to the related art. In FIG. 1, an organic ELD device 10 includes first and second substrates 1 and 3 facing each other. The first and second substrates 1 and 3 are spaced apart from and attached to each other with a seal pattern 20 corresponding to a boundary portion of the first and second substrates 1 and 3. A driving thin film transistor (TFT) DTr is formed in each pixel region P on the first substrate 1. In addition, a first electrode 11 connected to the driving TFT DTr, an organic luminescent layer 13 emitting a colored light and a second electrode 15 are sequentially formed in each pixel region P on the first substrate 1. The organic luminescent layer 13 includes red, green and blue luminescent layers 13a, 13b and 13c, which include organic emitting materials emitting red, green and blue lights, respectively. The first and second electrodes 11 and 15 and the organic luminescent layer 13 therebetween constitute an organic electroluminescent diode. In the organic ELD device 10, the first and second electrodes 11 and 15 function as anode and cathode, respectively.

Since the organic luminescent layer of the organic electroluminescent diode is susceptible to moisture and oxygen, encapsulation of the organic ELD device 10 for protecting the organic electroluminescent diode from moisture and oxygen of the atmosphere has been widely researched.

SUMMARY OF THE INVENTION

Accordingly, the present invention is directed to an organic electroluminescent display device and a method of fabricating the same that substantially obviate one or more of the problems due to limitations and disadvantages of the related art.

An object of the present invention is to provide an organic ELD device where an organic electroluminescent diode is effectively encapsulated and fabrication cost is reduced and a method of fabricating the organic ELD device.

Another object of the present invention is to provide an organic ELD device where distortion and warpage are minimized and heat is effectively radiated and a method of fabricating the organic ELD device.

Another object of the present invention is to provide an organic ELD device having a light weight and a thin profile and a method of fabricating the organic ELD device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method for fabricating an organic electroluminescent display device includes: forming a switching thin film transistor, a driving thin film transistor and an organic electroluminescent diode on a mother substrate having a plurality of unit cell areas; forming a cutting portion in a metal foil having a plurality of unit metal foil areas, the metal foil having a size corresponding to the mother substrate; forming an adhesive layer on the metal foil; attaching the mother substrate and the metal foil such that the adhesive layer contacts the mother substrate; and cutting the mother substrate and the metal foil along the cutting portion.

In another aspect, an organic electroluminescent display device includes: an array substrate including a plurality of pixel regions; a switching thin film transistor, a driving thin film transistor and an organic electroluminescent diode in each of the plurality of pixel regions on the array substrate; a unit adhesive layer on the switching thin film transistor, the driving thin film transistor and the organic electroluminescent diode, the unit adhesive layer covering a boundary portion of the plurality of pixel regions; and a unit metal foil on the unit adhesive layer, the unit metal foil including a cutting portion corresponding to the boundary portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
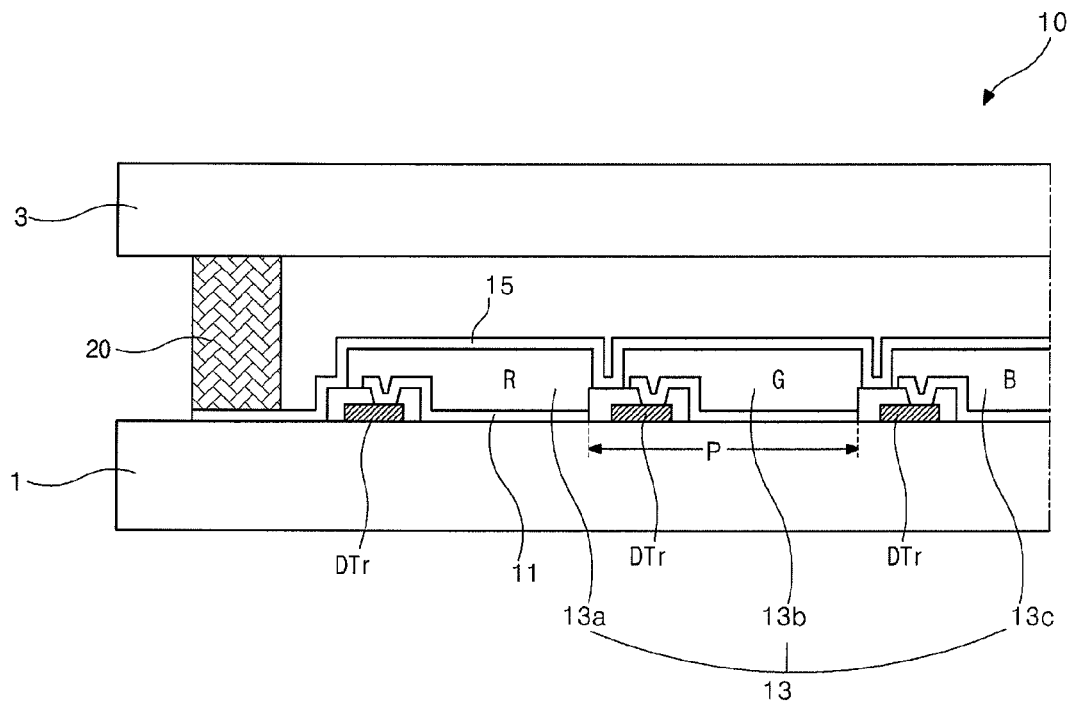
FIG. 1 is a cross-sectional view showing an organic electroluminescent display device of a bottom emission type according to the related art.
Figure 2:
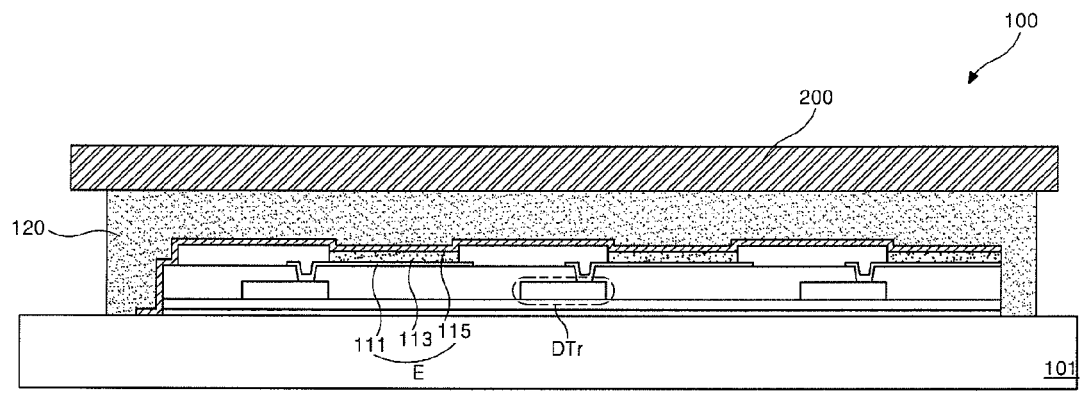
FIG. 2 is a cross-sectional view showing an organic electroluminescent display device of a bottom emission type according to a first embodiment of the present invention.

FIG. 2 is a cross-sectional view showing an organic electroluminescent display device of a bottom emission type according to a first embodiment of the present invention.

In FIG. 2, the organic electroluminescent display (ELD) device 100 includes an array substrate 101 where a driving thin film transistor (TFT) DTr, a switching TFT (not shown) and an organic electroluminescent (EL) diode E are formed thereon and a metal foil 200. The driving TFT DTr is formed in each pixel region P on the array substrate 101, and the organic EL diode E includes a first electrode 111 connected to the driving TFT DTr, an organic luminescent layer 113 emitting a colored light on the first electrode 111 and a second electrode 115 on the organic luminescent layer 113. In the organic ELD device 100, the first and second electrodes 111 and 115 function as an anode and a cathode, respectively.

The metal foil 200 is formed over the driving TFT DTr and the organic EL diode E. The array substrate 101 and the metal foil 200 are attached to each other with an adhesive layer 120 having moisture absorption property and adhesive property, and the organic EL diode E of the array substrate 101 is encapsulated by the metal foil 200.

Since the relatively thin metal foil 200 is used for encapsulation of the organic EL diode E, the organic ELD device 100 has a thin profile as compared with the related art organic ELD device where a glass substrate is used for encapsulation. Although the thickness of the organic ELD device 100 is reduced, the durability of the organic ELD device 100 increases and the heat radiation property of the organic ELD device 100 is improved due to the metal foil 200.

In addition, since the adhesive layer 120 absorbs moisture of the atmosphere, penetration of the moisture to the organic luminescent layer 113 is prevented by the adhesive layer 120. As a result, the related art seal pattern, through which a contamination source such as moisture or gas penetrates when heated or driven for a long time, is omitted. Further, since the adhesive layer 120 absorbs pressure such as push added to the organic ELD device 100, transfer of the pressure to the organic EL diode E is prevented by the adhesive layer 120. As a result, crack of the first and second electrodes 111 and 115 of the organic EL diode E and the driving TFT DTr is prevented and deterioration such as a dark spot is also prevented. Accordingly, brightness and display quality of the organic EL device 100 are improved.

FIGS. 3A to 3H are cross-sectional views showing a fabrication process for an organic electroluminescent display device according to a first embodiment of the present invention.

Figure 3A:
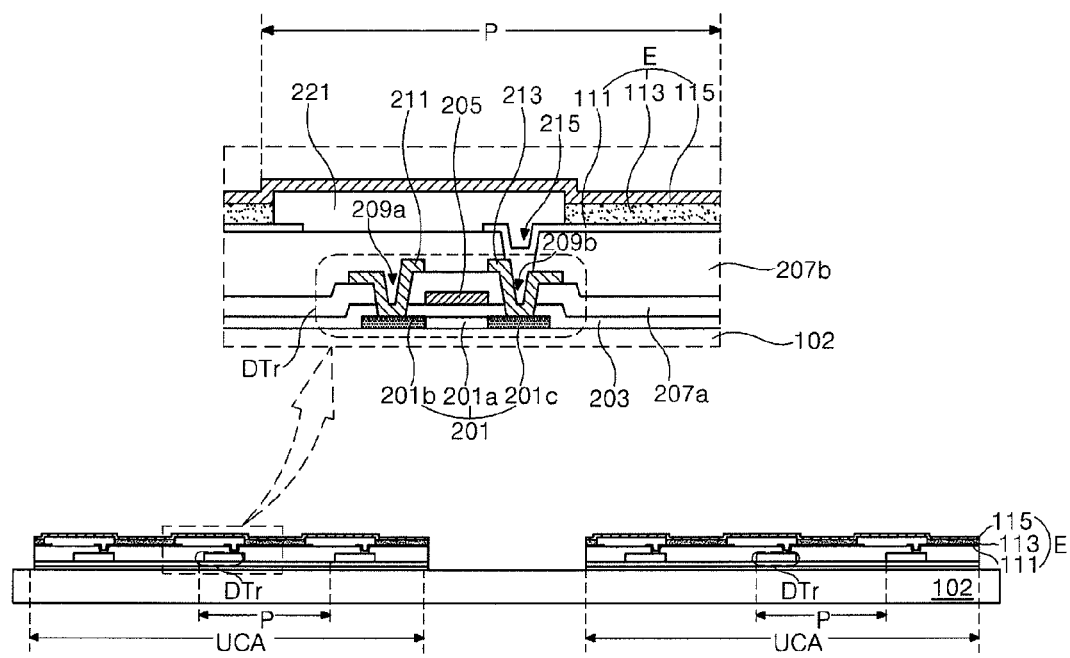
FIGS. 3A to 3H are cross-sectional views showing a fabrication process for an organic electroluminescent display device according to a first embodiment of the present invention.

In FIG. 3A, a mother substrate 102 includes a plurality of unit cell areas UCA, and a switching thin film transistor (TFT) (not shown), a driving TFT DTr and an organic electroluminescent (EL) diode E are formed in each unit cell area UCA of the mother substrate 102. The mother substrate 102 may include a glass or a transparent plastic. Each unit cell area UCA includes a plurality of pixel regions P. The mother substrate 102 is cut in a subsequent process to become a plurality of array substrates 101 (of FIG. 3H), and each of the plurality of array substrates 101 constitutes an organic electroluminescent display (ELD) device 100 (of FIG. 3H).

After an amorphous silicon layer (not shown) is formed in each pixel region P on the mother substrate 102 by depositing amorphous silicon, the amorphous silicon layer is crystallized by a laser beam irradiation or a heat treatment to become a polycrystalline silicon layer (not shown). Next, a semiconductor layer 201 of intrinsic polycrystalline silicon is formed by patterning the polycrystalline silicon layer. For example, the polycrystalline silicon layer may be patterned by using a photolithographic process including exposing and developing steps. Although not shown in FIG. 3A, a buffer layer may be formed on the mother substrate 102 by depositing one of silicon nitride (SiNx) and silicon oxide ($SiO_2$) before the amorphous silicon layer is formed on the mother substrate 102.

Next, a gate insulating layer 203 is formed on the semiconductor layer 201 by depositing silicon oxide ($SiO_2$), and a gate electrode 205 is formed on the gate insulating layer 203 by depositing and patterning a metallic material such as aluminum (Al), aluminum (Al) alloy, e.g., aluminum neodymium (AlNd), copper (Cu) and copper (Cu) alloy. For example, a metallic material layer may be patterned by using a photolithographic process including exposing and developing steps. The gate electrode 205 corresponds to a central portion of the semiconductor layer 201.

Next, the semiconductor layer 201 is doped with impurities using the gate electrode 205 as a doping mask to form an active region 201a corresponding to the gate electrode 205 and source and drain regions 201b and 201c at both sides of the active region 201a. The impurities may include elements of group III or group V. Next, a first interlayer insulating layer 207a is formed on the gate electrode 205 by depositing an inorganic insulating material such as silicon nitride (SiNx)

and silicon oxide (SiO$_2$), and the first interlayer insulating layer 207a and the gate insulating layer 203 are patterned to form first and second semiconductor contact holes 209a and 209b exposing the source and drain regions 201b and 201c, respectively.

Next, source and drain electrodes 211 and 213 are formed on the first interlayer insulating layer 207a by depositing and patterning a metallic material such as aluminum (Al), aluminum (Al) alloy, e.g., aluminum neodymium (AlNd), copper (Cu), copper (Cu) alloy, chromium (Cr) and molybdenum (Mo). For example, a metallic material layer may be patterned by using a photolithographic process including exposing and developing steps. The source electrode 211 is connected to the source region 201b through the first semiconductor contact hole 209a and the drain electrode 213 is connected to the drain region 201c through the second semiconductor contact hole 209b. The semiconductor layer 201, the gate insulating layer 203, the gate electrode 205, the first interlayer insulating layer 207a, the source electrode 211 and the drain electrode 213 constitute the driving TFT DTr.

Next, a second interlayer insulating layer 207b is formed on the source and drain electrodes 211 and 213 by coating and patterning an organic insulating material such as benzocyclobutene (BCB) and photo acryl. For example, the second interlayer insulating layer 207b may be patterned by using a photolithographic process including exposing and developing steps to form a drain contact hole 215 exposing the drain electrode 213.

Next, a first electrode 111 is formed on the second interlayer insulating layer 207b. The first electrode 111 is connected to the drain electrode 213 through the drain contact hole 215 and functions as an anode for an organic electroluminescent (EL) diode E. In addition, a bank 221 is formed on the first electrode 111 by coating and patterning a photosensitive organic insulating material such as black resin, graphite powder, gravure ink, black spray and black enamel. The bank 221 having a matrix shape is disposed to correspond to a boundary portion of the pixel region P. Further, an organic luminescent layer 113 is formed on the first electrode 111 exposed through the bank 221 by coating or depositing an organic luminescent material. Although not shown in FIG. 3A, the organic luminescent layer 113 may have a single layer or a multiple layer including a hole injection layer, a hole transporting layer, an emitting material layer, an electron transporting layer and an electron injection layer.

Moreover, a second electrode 115 is formed on the organic luminescent layer 113. The second electrode 115 functions as a cathode for the organic EL diode E. For example, the second electrode 115 may include a half transmissive metallic material layer and a transparent conductive material layer. The half transmissive metallic material layer may have a work function lower than the first electrode 111, and the transparent conductive material layer may be thicker than the half transmissive metallic material layer. The first electrode 111, the organic luminescent layer 113 and the second electrode 115 constitute the organic EL diode E. Although the unit cell area UCA including two pixel regions P are shown for illustration in FIG. 3A, the unit cell area UCA may include a plurality of pixel regions, for example, several thousands of pixel regions.

Figure 3B:
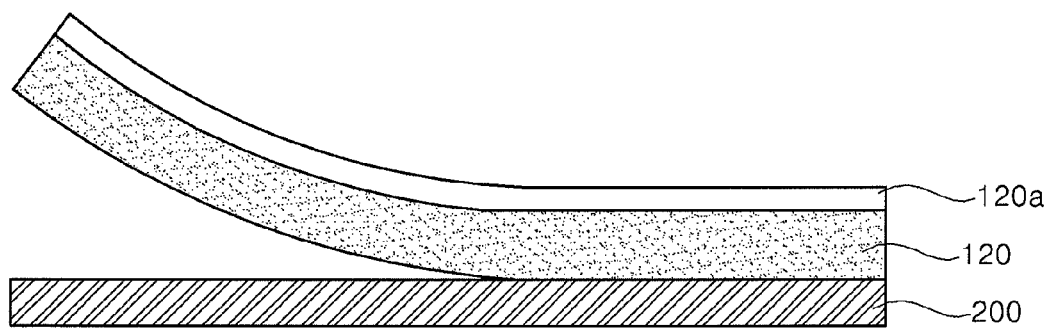

In FIG. 3B, a unit adhesive layer 120 is formed on a unit metal foil 200 for encapsulation, and a unit protecting film 120a is formed on the unit adhesive layer 120. The unit adhesive layer 120 may have a hydrophobic property or may include a material such as barium oxide (BaO) and calcium oxide (CaO) having a moisture absorption property. The unit protecting film 120a may be removed before the unit metal foil 200 is attached to the mother substrate 102. Since the unit metal foil 200 is used for encapsulation, the mother substrate 102 may include a glass or a transparent plastic so that the organic ELD device 100 has a bottom emission type. In addition, the unit metal foil 200 has an area corresponding to the unit cell area UCA. The unit metal foil 200, the unit adhesive layer 120 and the unit protecting film 120a constitute a unit encapsulating substrate 230.

Figure 3C:
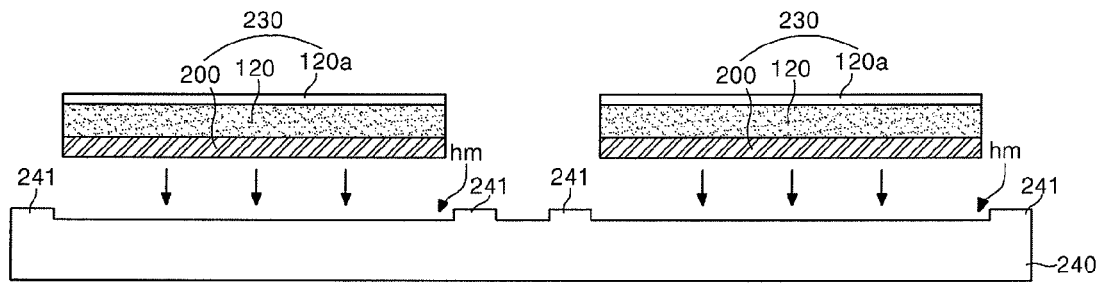

In FIG. 3C, a plurality of unit encapsulating substrates 230 is disposed on a supporting substrate 240. Since each unit encapsulating substrate 230 has a thickness of about 10 µm to about 50 µm, each unit encapsulating substrate 230 has flexibility. Accordingly, the supporting substrate 240 is required to prevent movement of each unit encapsulating substrate 230 including the unit metal foil 200. The supporting substrate 240 includes a plurality of grooves hm and each groove hm is surrounded by a supporting portion 241. In addition, the supporting substrate 240 may include a glass. The plurality of unit encapsulating substrates 230 are disposed in the plurality of grooves hm, respectively, and each unit encapsulating substrate 230 is fixed by the supporting portion 241.

Figure 3D:
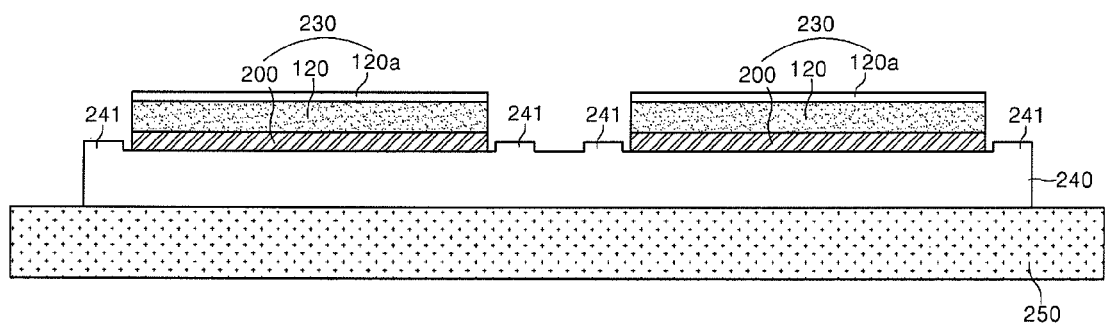

In FIG. 3D, the supporting substrate 240 having the plurality of unit encapsulating substrates 230 is disposed on a stage 250 of an attaching apparatus.

Figure 3E:
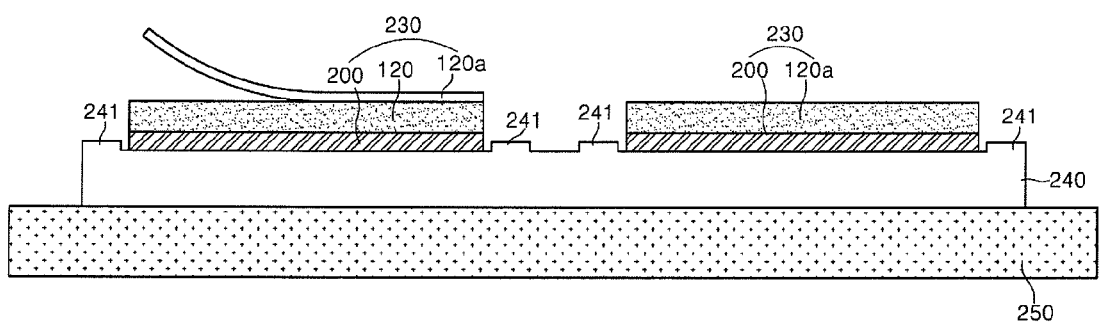

In FIG. 3E, the plurality of unit protecting films 120a are removed from the plurality of unit encapsulating substrates 230 and the plurality of unit adhesive layers 120 are exposed.

Figure 3F:
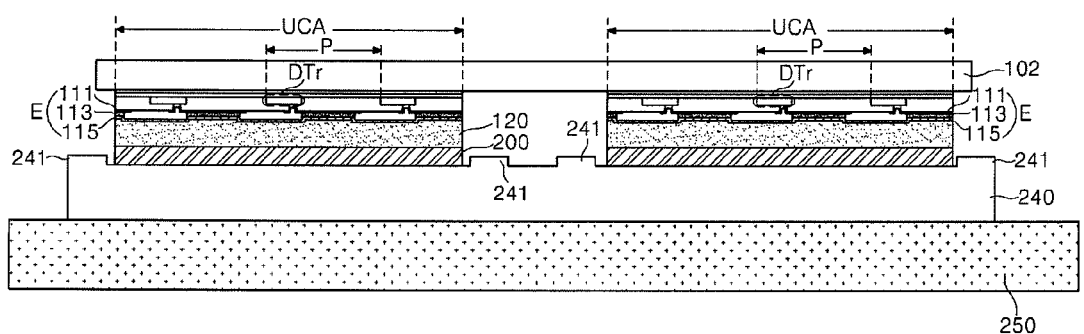

In FIG. 3F, the mother substrate 102 having the driving TFT DTr and the organic EL diodes E thereon is disposed over and aligned to the plurality of unit encapsulating substrates 230 such that the second electrode 115 of each unit cell area UCA faces the unit adhesive layer 120. The mother substrate 102 is pressurized so that the second electrode 115 can completely contact the unit adhesive layer 120. Accordingly, the mother substrate 102 and the plurality of unit encapsulating substrates 230 are attached to each other to form a plurality of organic ELD devices 100.

Figure 3G:
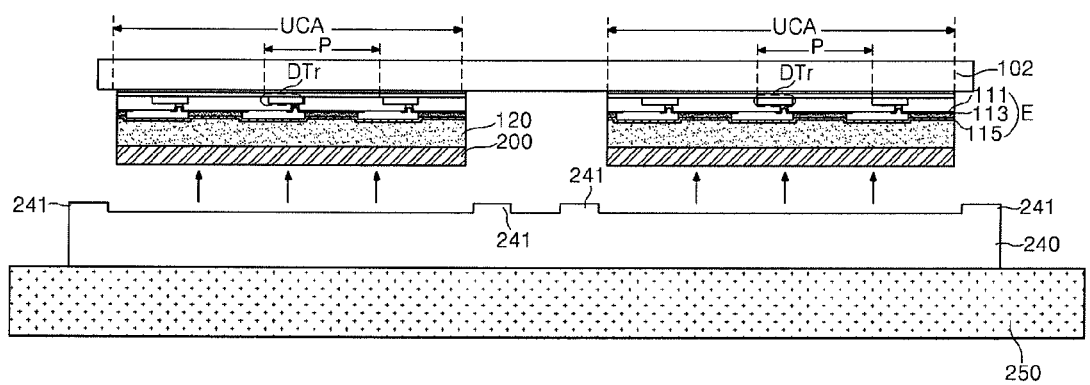

In FIG. 3G, the attached mother substrate 102 and the plurality of unit encapsulating substrates 230 are detached from the supporting substrate 240.

Figure 3H:
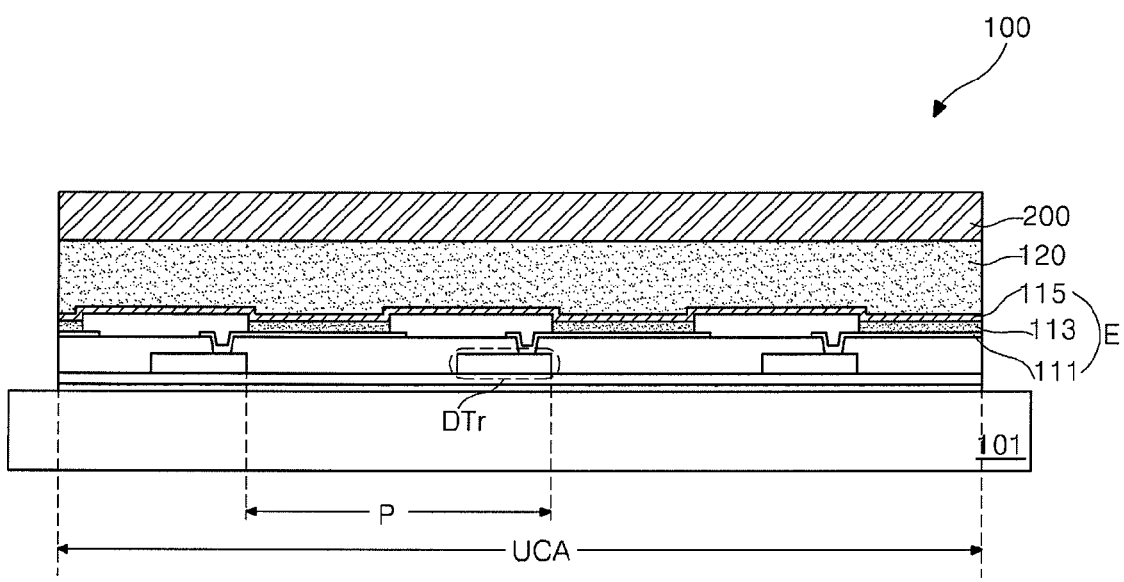

In FIG. 3H, the mother substrate 102 is cut into a plurality of array substrates 101 such that the plurality of organic ELD devices 100 are divided. Accordingly, the plurality of organic ELD devices 100 each including the array substrate 101 having the switching TFT (not shown), the driving TFT DTr and the organic EL diode E thereon and the unit metal foil 200 for encapsulation are completed.

In the fabrication process for an organic ELD device according to the first embodiment of the present invention, the supporting substrate 240 is required to prevent movement of the plurality of unit metal foils 200 while the mother substrate 102 and the plurality of unit encapsulating substrates 230 are attached to each other. Accordingly, an additional step of aligning the plurality of unit encapsulating substrates 230 to the plurality of grooves hm of the supporting substrate 240 is required for accuracy, and the efficiency of the fabrication process is reduced by the additional step. Specifically, since the unit metal foils 200 has a size corresponding to the unit cell area UCA, the groove hm of the supporting substrate 240 is required to have a size corresponding to the unit cell area UCA. As a result, a plurality of supporting substrates 240 having various-sized grooves hm are required for producing the various-sized organic ELD devices and initial investment for production increases due to the plurality of supporting substrates 240.

A fabrication process for an organic ELD device where an encapsulation step is performed without using a supporting substrate will be illustrated hereinafter.

FIGS. 4A to 4H are cross-sectional views showing a fabrication process for an organic electroluminescent display device according to a second embodiment of the present invention.

Figure 4A:
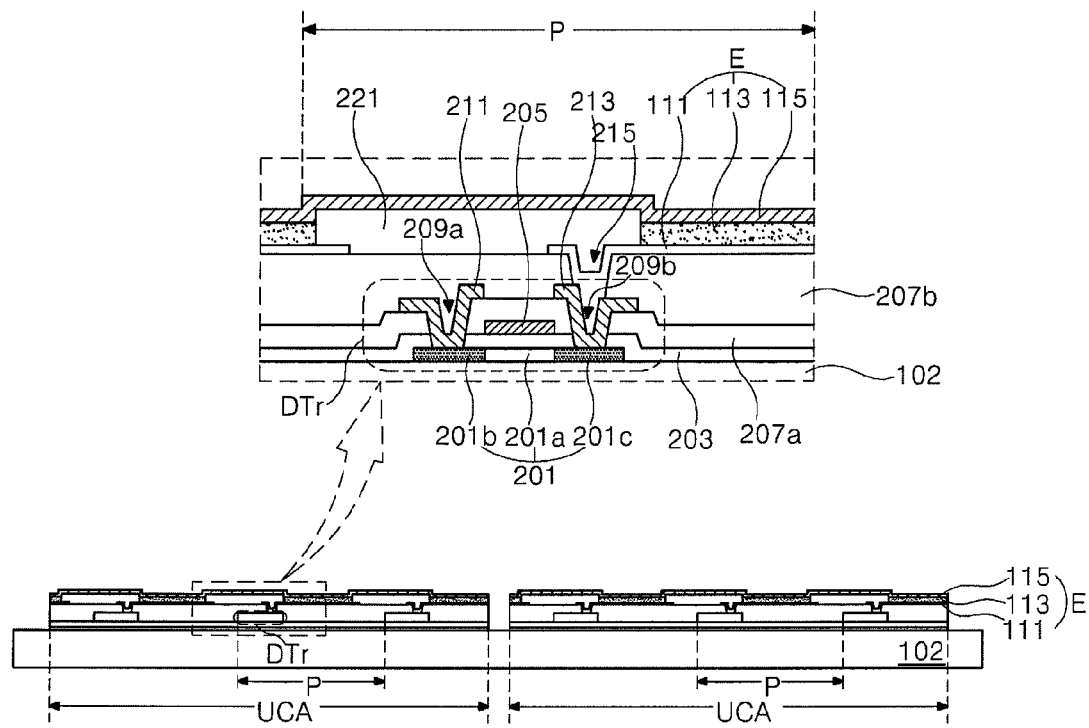
FIGS. 4A to 4H are cross-sectional views showing a fabrication process for an organic electroluminescent display device according to a second embodiment of the present invention.

In FIG. 4A, a mother substrate 102 includes a plurality of unit cell areas UCA, and a switching thin film transistor (TFT) (not shown), a driving TFT DTr and an organic electroluminescent (EL) diode E are formed in each unit cell area UCA of the mother substrate 102. The mother substrate 102 may include a glass or a transparent plastic. Each unit cell area UCA includes a plurality of pixel regions P. The mother substrate 102 is cut in a subsequent process to become a plurality of array substrates 101 (of FIG. 4H), and each of the plurality of array substrates 101 constitutes an organic electroluminescent display (ELD) device 100 (of FIG. 4H).

After an amorphous silicon layer (not shown) is formed in each pixel region P on the mother substrate 102 by depositing amorphous silicon, the amorphous silicon layer is crystallized by a laser beam irradiation or a heat treatment to become a polycrystalline silicon layer (not shown). Next, a semiconductor layer 201 of intrinsic polycrystalline silicon is formed by patterning the polycrystalline silicon layer. For example, the polycrystalline silicon layer may be patterned by using a photolithographic process including exposing and developing steps. Although not shown in FIG. 4A, a buffer layer may be formed on the mother substrate 102 by depositing one of silicon nitride (SiNx) and silicon oxide ($SiO_2$) before the amorphous silicon layer is formed on the mother substrate 102.

Next, a gate insulating layer 203 is formed on the semiconductor layer 201 by depositing silicon oxide ($SiO_2$), and a gate electrode 205 is formed on the gate insulating layer 203 by depositing and patterning a metallic material such as aluminum (Al), aluminum (Al) alloy, e.g., aluminum neodymium (AlNd), copper (Cu) and copper (Cu) alloy. For example, a metallic material layer may be patterned by using a photolithographic process including exposing and developing steps. The gate electrode 205 corresponds to a central portion of the semiconductor layer 201.

Next, the semiconductor layer 201 is doped with impurities using the gate electrode 205 as a doping mask to form an active region 201a corresponding to the gate electrode 205 and source and drain regions 201b and 201c at both sides of the active region 201a. The impurities may include elements of group III or group V. Next, a first interlayer insulating layer 207a is formed on the gate electrode 205 by depositing an inorganic insulating material such as silicon nitride (SiNx) and silicon oxide ($SiO_2$), and the first interlayer insulating layer 207a and the gate insulating layer 203 are patterned to form first and second semiconductor contact holes 209a and 209b exposing the source and drain regions 201b and 201c, respectively.

Next, source and drain electrodes 211 and 213 are formed on the first interlayer insulating layer 207a by depositing and patterning a metallic material such as aluminum (Al), aluminum (Al) alloy, e.g., aluminum neodymium (AlNd), copper (Cu), copper (Cu) alloy, chromium (Cr) and molybdenum (Mo). For example, a metallic material layer may be patterned by using a photolithographic process including exposing and developing steps. The source electrode 211 is connected to the source region 201b through the first semiconductor contact hole 209a and the drain electrode 213 is connected to the drain region 201c through the second semiconductor contact hole 209b. The semiconductor layer 201, the gate insulating layer 203, the gate electrode 205, the first interlayer insulating layer 207a, the source electrode 211 and the drain electrode 213 constitute the driving TFT DTr.

Next, a second interlayer insulating layer 207b is formed on the source and drain electrodes 211 and 213 by coating and patterning an organic insulating material such as benzocyclobutene (BCB) and photo acryl. For example, the second interlayer insulating layer 207b may be patterned by using a photolithographic process including exposing and developing steps to form a drain contact hole 215 exposing the drain electrode 213.

Next, a first electrode 111 is formed on the second interlayer insulating layer 207b. The first electrode 111 is connected to the drain electrode 213 through the drain contact hole 215 and functions as an anode for an organic electroluminescent (EL) diode E. In addition, a bank 221 is formed on the first electrode 111 by coating and patterning a photosensitive organic insulating material such as black resin, graphite powder, gravure ink, black spray and black enamel. The bank 221 having a matrix shape is disposed to correspond to a boundary portion of the pixel region P. Further, an organic luminescent layer 113 is formed on the first electrode 111 exposed through the bank 221 by coating or depositing an organic luminescent material. Although not shown in FIG. 3A, the organic luminescent layer 113 may have a single layer or a multiple layer including a hole injection layer, a hole transporting layer, an emitting material layer, an electron transporting layer and an electron injection layer.

Moreover, a second electrode 115 is formed on the organic luminescent layer 113. The second electrode 115 functions as a cathode for the organic EL diode E. For example, the second electrode 115 may include a half transmissive metallic material layer and a transparent conductive material layer. The half transmissive metallic material layer may have a work function lower than the first electrode 111, and the transparent conductive material layer may be thicker than the half transmissive metallic material layer. The first electrode 111, the organic luminescent layer 113 and the second electrode 115 constitute the organic EL diode E. Although the unit cell area UCA including two pixel regions P are shown for illustration in FIG. 3A, the unit cell area UCA may include a plurality of pixel regions P, for example, several thousands of pixel regions P.

Figure 4B:
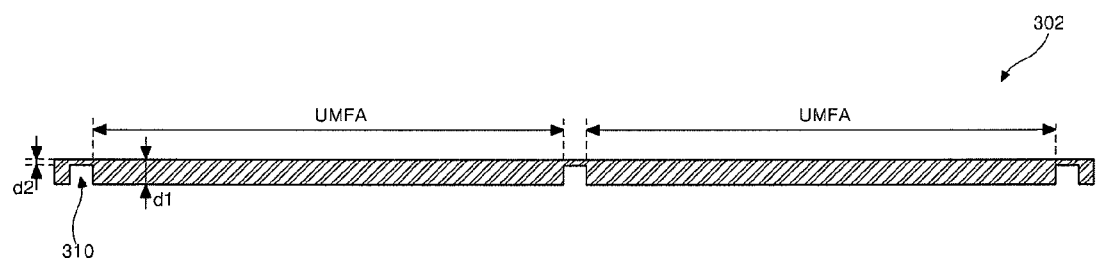

In FIG. 4B, a first surface of a metal foil 302 for encapsulation is partially etched and a cutting portion 310 is formed in the metal foil 302. The metal foil 302 may have a size corresponding to the mother substrate 102. In addition, the metal foil 302 includes a plurality of unit metal foil areas UMFA each corresponding to the unit cell area UCA, and the cutting portion 310 corresponds to a border portion between the adjacent unit metal foil areas UMFA. As a result, the metal foil 302 has a first thickness d1 in each of the plurality of unit metal foil areas UFMA, and the metal foil 302 corresponding to the cutting portion 310 has a second thickness d2 smaller than the first thickness d1. For example, the first thickness d1 may be within a range of about 0.02 mm to about 0.7 mm and the second thickness d2 may be within a range of about 30% to about 95%, preferably about 30% to about 50%, of the first thickness d1. The metal foil 302 is cut in a subsequent process to become a plurality of unit metal foils 300 (of FIG. 4H), and each of the plurality of unit metal foils 300 is used for encapsulation of an organic ELD device 100 (of FIG. 4H). Since the metal foil 302 is cut along the cutting portion 310 having the relatively small second thickness d2, the metal foil 302 is easily divided into the plurality of unit metal foils 300.

Figure 4C:
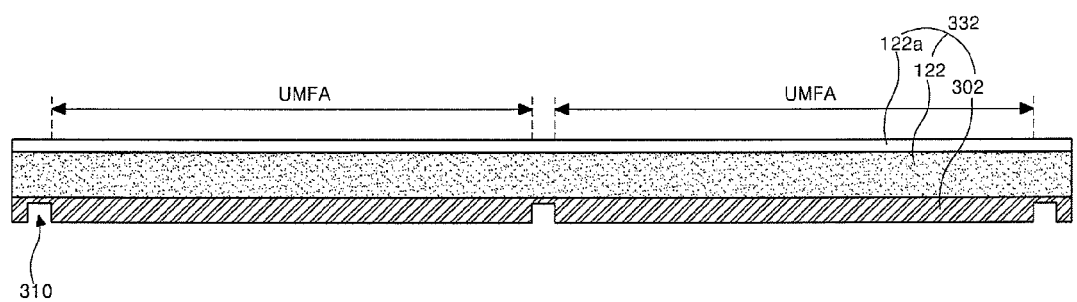

In FIG. 4C, an adhesive layer 122 is formed on a second surface, which is opposite to the first surface, of the metal foil 302, and a protecting film 122a is formed on the adhesive layer 122. The adhesive layer 122 may have a hydrophobic property or may include a material such as barium oxide (BaO) and calcium oxide (CaO) having a moisture absorption property. In addition, the adhesive layer may include a film type of a solid phase or may be formed by using a material of a liquid phase. For example, the adhesive layer may have a thickness of about 3 µm to about 50 µm. Although the adhesive layer 122 is used without patterning in the second embodiment, an adhesive layer may be patterned such that a portion corresponding to lines and pads of the mother substrate is partially removed in another embodiment. The protecting film 122a may be removed before the metal foil 302 is attached to the mother substrate 102. Since the metal foil 302 is used for encapsulation, the mother substrate 102 may include a glass or a transparent plastic so that the organic ELD device 100 has a bottom emission type. The metal foil 302, the adhesive layer 122 and the protecting film 122a constitute an encapsulating substrate 332.

Figure 4D:
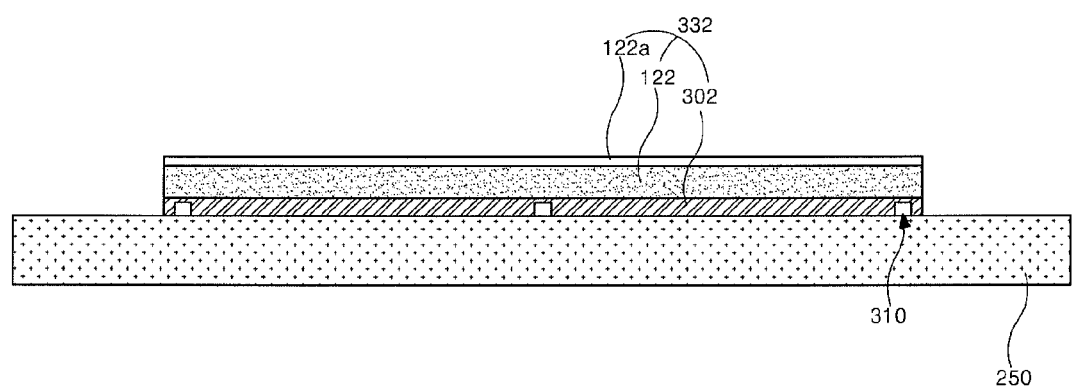

In FIG. 4D, the encapsulating substrate 332 having the metal foil 302, the adhesive layer 122 and the protecting film 122a is disposed on a stage 250 of an attaching apparatus. Since the plurality of unit metal foils 300 are connected to each other in the metal foil 302, the supporting substrate 240 (of FIG. 3C) for preventing the movement of the plurality of unit metal foils 300 is not required in the second embodiment. In addition, a step of aligning the plurality of unit metal foils 300 to the plurality of grooves hm (of FIG. 3C) is not required in the second embodiment. Further, since the metal foil 302 includes the plurality of unit metal foil 300 each having various sizes, the metal foil 302 may be applied to the various-sized organic ELD devices. As a result, the efficiency of the fabrication process is improved, and the initial investment is reduced.

Figure 4E:
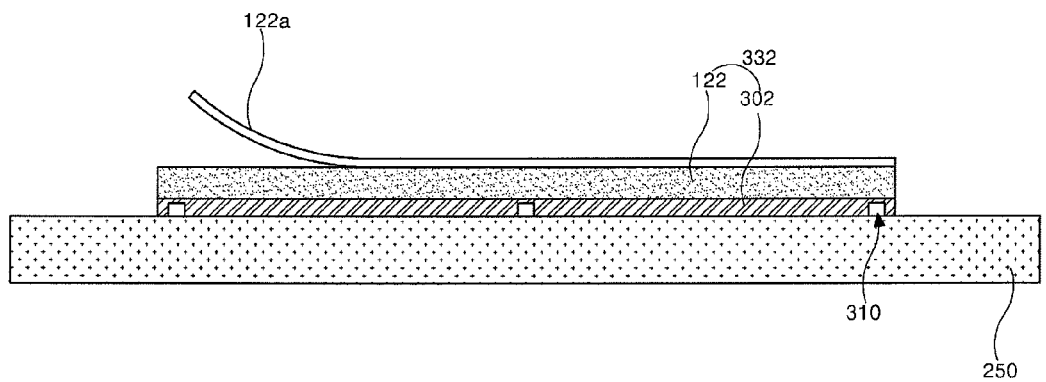

In FIG. 4E, the protecting film 122a is removed from the encapsulating substrate 332 and the adhesive layer 122 is exposed.

Figure 4F:
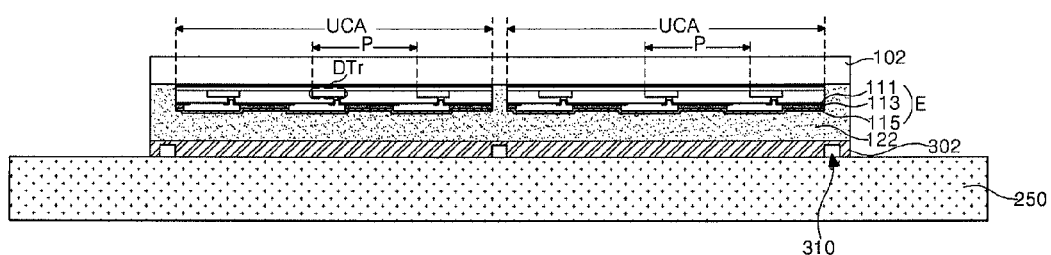

In FIG. 4F, the mother substrate 102 having the driving TFT DTr and the organic EL diodes E thereon is disposed over and aligned to the encapsulating substrate 332 such that the second electrode 115 of each unit cell area UCA faces the adhesive layer 122 in each unit metal foil area UMFA. The mother substrate 102 is pressurized so that the second electrode 115 can completely contact the adhesive layer 122. Accordingly, the mother substrate 102 and the encapsulating substrates 332 are attached to each other to form a plurality of organic ELD devices 100.

Figure 4G:
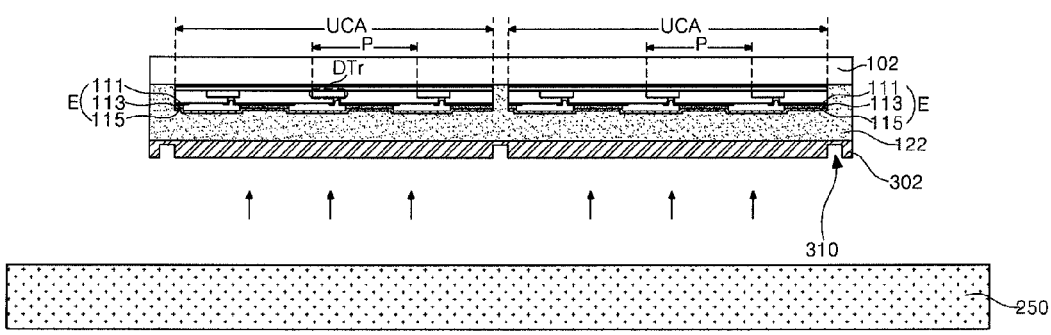

In FIG. 4G, the attached mother substrate 102 and the encapsulating substrate 332 are detached from the stage 250.

Figure 4H:
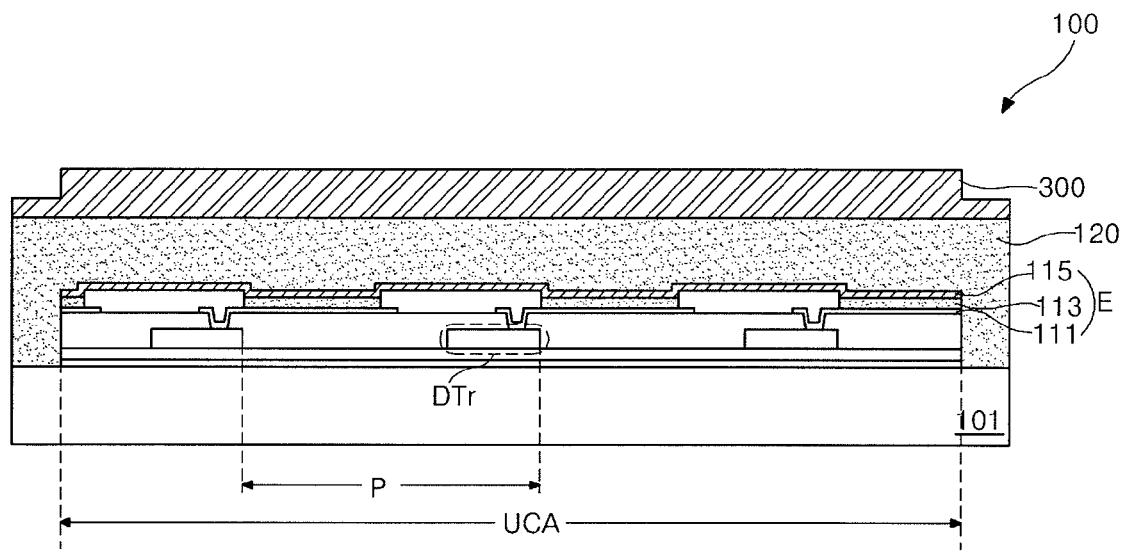

In FIG. 4H, the attached mother substrate 102 and the encapsulating substrate 332 are cut along the cutting portion 310 by a scribing apparatus (not shown) using a laser beam or a mechanical wheel scriber as a cutting means such that the mother substrate 102 is divided into the plurality of array substrates 101 and the metal foil 302 is divided into the plurality of unit metal foils 300. In addition, the adhesive layer 122 is divided into a plurality of unit adhesive layers 120. As a result, the plurality of organic ELD devices 100 each including the array substrate 101 having the switching TFT (not shown), the driving TFT DTr and the organic EL diode E thereon and the unit metal foil 300 for encapsulation are completed. Although the metal foil 302 includes a metallic material having a relatively high hardness, the metal foil 302 is easily cut along the cutting portion 310 by the scribing apparatus because the cutting portion 310 has the relatively thin second thickness d2. Further, since the adhesive layer 122 corresponds to and covers the entire metal foil 302 including the cutting portion 310, the unit adhesive layer 120 covers the entire array substrate 101 including a portion corresponding to the cutting portion 310. Accordingly, the unit adhesive layer 120 covers a boundary portion of the plurality of pixel regions PA such that the switching TFT, the driving TFT DTr and the organic electroluminescent diode E in the outermost pixel region is not exposed. As a result, efficiency in prevention of penetration of moisture is improved.

Since the unit metal foil 300 has a thickness smaller than a glass substrate, the organic ELD device 100 including the unit metal foil 300 for encapsulation has a thickness smaller than the related art organic ELD device including the glass substrate for encapsulation. In addition, since the unit metal foil 300 has a hardness greater than a glass substrate, the organic ELD device 100 including the unit metal foil 300 for encapsulation has a durability greater than the related art organic ELD device including the glass substrate for encapsulation. Moreover, since the unit metal foil 300 has a heat radiation greater than a glass substrate, the organic ELD device 100 including the unit metal foil 300 for encapsulation has a heat radiation property greater than the related art organic ELD device including the glass substrate for encapsulation.

Further, since the unit adhesive layer 120 prevents penetration of moisture and absorbs the moisture due to the moisture absorption property thereof, contact of the moisture and the organic EL diode E is prevented and a seal pattern is omitted. As a result, penetration of contamination source such as moisture or gas through the seal pattern which is heated or driven for a long time is prevented.

Since the unit metal foil 300 has a relatively high hardness, the unit adhesive layer 120 does not pressurize the array substrate 101 even when a pressure is applied to the unit metal foil 300, and cracks of the first and second electrodes 111 and 115 of the organic EL diode E or the driving TFT DTr are prevented. As a result, deterioration such as a dark spot is prevented and the non-uniformity in brightness or display quality is prevented. Specifically, since the metal foil 302 including the plurality of unit metal foils 300 is used in the fabrication process according to the second embodiment, a supporting substrate 240 is not required. Accordingly, the initial investment for production is reduced and the efficiency of fabrication process is improved.

In addition, since the unit adhesive layer 120 covers the entire array substrate 101 in the fabrication process according to the second embodiment, warpage or bending of the organic ELD device 100 is minimized.

Figure 5A:
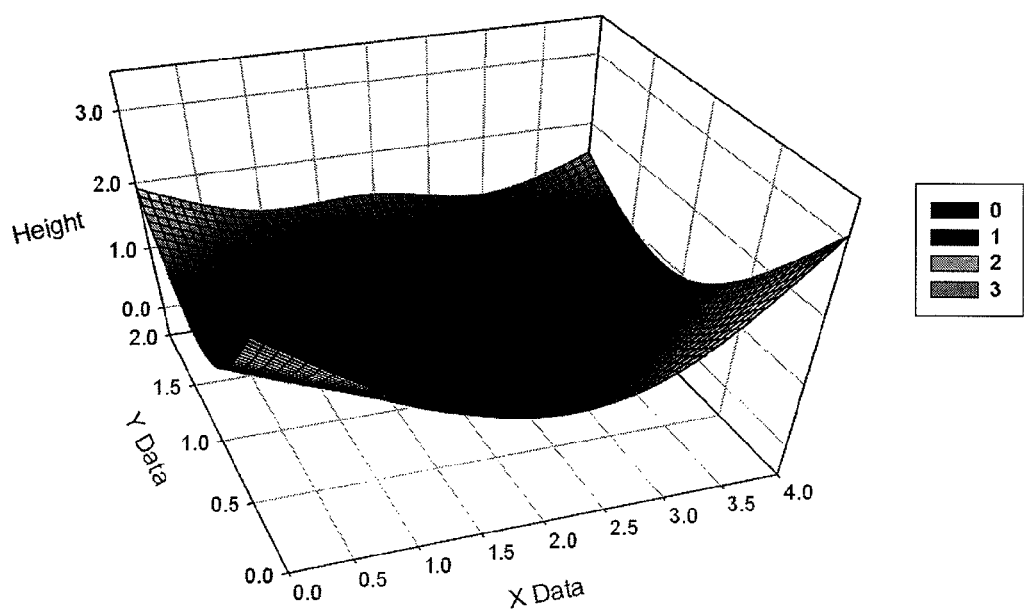
FIGS. 5A and 5B are graphs showing a surface height with respect to a horizontal position of organic electroluminescent display devices according to first and second embodiments, respectively, of the present invention.
Figure 5B:
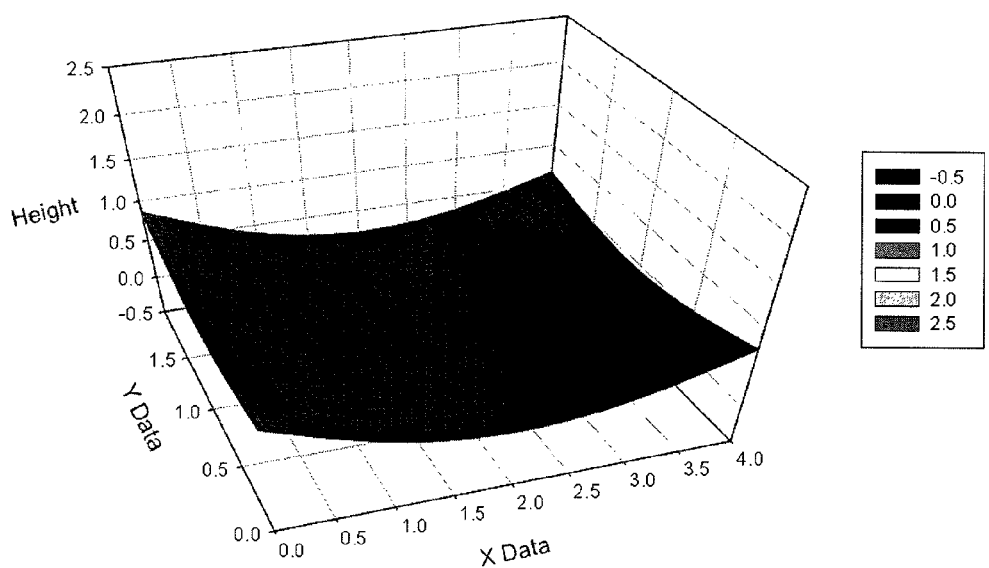

FIGS. 5A and 5B are graphs showing a surface height with respect to a horizontal position of organic electroluminescent display devices according to first and second embodiments, respectively, of the present invention.

In FIGS. 5A and 5B, each of the organic ELD devices according to the first and second embodiments includes an array substrate 101 of a glass and a unit metal foil for encapsulation attached to each other. Heights of 12 boundary portions of a top surface of each organic ELD device are measured with respect to a central portion of the top surface. The 12 boundary portions correspond to four corner portions, four side portions between the two corners along each long side and one side portion along each short side of the top surface of a rectangular shape.

In FIG. 5A, the height difference between the boundary portion and the central portion is within a range of about 1.5 to about 3 (arbitrary unit: A.U.). Since the array substrate 101 (of FIG. 3H) and the unit metal foil 200 (of FIG. 3H) are formed of different materials such as a glass and a metal, the array substrate 101 and the unit metal foil 200 have different thermal expansion coefficients. As a result, the array substrate 101 and the unit metal foil 200 contract and expand with different degree. The deformation of the array substrate 101 and the unit metal foil 200 with different degree causes a warpage, a bending and a distortion of the organic ELD device 100 (of FIG. 3H). When the thermal expansion coefficient of the unit metal foil 200 is smaller than the thermal expansion coefficient of the array substrate 101, the organic ELD device 100 may be upwardly bent such that a boundary portion of the top surface is higher than the central portion of the top surface. When the organic ELD device 100 has the bending, a driving circuit may be misaligned to pads of the organic ELD device 100 during a step of attaching the driving circuit to the organic ELD device 100. As a result, the organic ELD device 100 has a line defect or deterioration in operation. Alternatively, the bending may cause deterioration in a step of attaching polarizing plates to the organic ELD device 100 and display quality may be degraded.

In FIG. 5B, the height difference between the boundary portion and the central portion is within a range of about 0.6 to about 0.8 (arbitrary unit: A.U.). Since the unit adhesive layer 120 (of FIG. 4H) is formed to cover the entire array substrate 101 (of FIG. 4H), the bending of the organic ELD device 100 (of FIG. 4H) is mitigated due to the unit adhesive layer 120.

The thermal expansion coefficient of the unit metal foil 300 (of FIG. 4H) is within a range of about $3.5 \times 10^{-6}$/° C. to about $4.5 \times 10^{-6}$/° C. As a result, difference between the thermal expansion coefficient of the unit metal foil 300 and the thermal expansion coefficient of the array substrate 101, which is about $5 \times 10^{-6}$/° C., is smaller than 30% of the thermal coefficient of the array substrate 100. When the difference between the thermal coefficients of the unit metal foil 300 and the array substrate 101 is greater than the thermal coefficient of the array substrate 101, the organic ELD device 100 may be deteriorated by the bending or the warpage even though the unit adhesive layer 120 is formed to cover the entire array substrate 101.

Figure 6A:
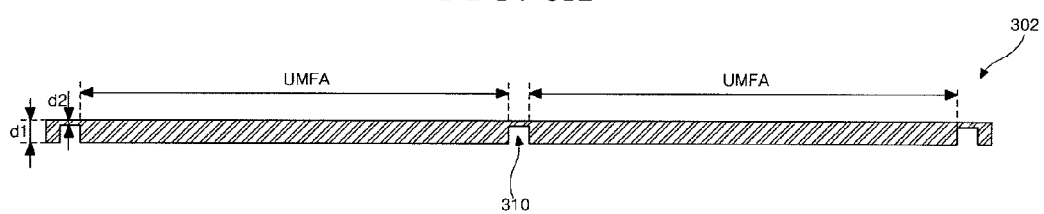
FIGS. 6A to 6C are cross-sectional views showing metal foils for organic electroluminescent display device according to second, third and fourth embodiments, respectively, of the present invention.
Figure 6B:
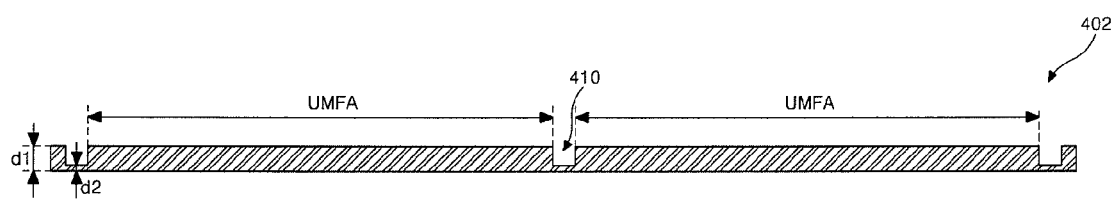
Figure 6C:
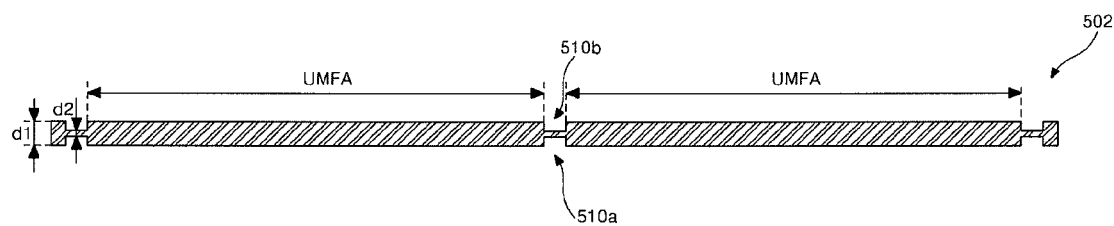

FIGS. 6A to 6C are cross-sectional views showing metal foils for organic electroluminescent display device according to second, third and fourth embodiments, respectively, of the present invention.

In FIG. 6A, a metal foil 302 having first and second surfaces opposite to each other includes a plurality of unit metal foil areas UMFA. In addition, a cutting portion 310 is formed at a border portion between the adjacent unit metal foil areas UMFA on the first surface of the metal foil 302. The metal foil 302 has a first thickness d1 in each of the plurality of unit metal foil areas UMFA and a second thickness d2 smaller than the first thickness d1 at the cutting portion 310.

In subsequent steps, an adhesive layer is formed on the second surface of the metal foil 302 and the metal foil 302 having the adhesive layer thereon is attached to a mother substrate having a switching TFT, a driving TFT and an organic EL diode. Further, the attached metal foil and the mother substrate are cut along the cutting portion 310 such that the metal foil 302 is divided into a plurality of unit metal foils.

In FIG. 6B, a cutting portion 410 is formed at a border portion between adjacent unit metal foil areas UMFA on a second surface of a metal foil 402. Similarly to the second embodiment, the metal foil 400 has a first thickness d1 in each unit metal foil area UMFA and a second thickness d2 smaller than the first thickness d1 at the cutting portion 410, and an adhesive layer is formed on the second surface of the metal foil 402 in a subsequent step.

In FIG. 6C, first and second cutting portions 510a and 510b are formed at a border portion between adjacent unit metal foil areas UMFA on first and second surfaces, respectively, of a metal foil 502. Similarly to the second and third embodiments, the metal foil 5020 has a first thickness d1 in each unit metal foil area UMFA and a second thickness d2 smaller than the first thickness d1 at the first and second cutting portions 510a and 510b, and an adhesive layer is formed on the second surface of the metal foil 502 in a subsequent step.

In FIGS. 6A to 6C, for example, the first thickness d1 may be within a range of about 0.02 mm to about 0.7 mm and the second thickness d2 may be within a range of 30% to about 95%, preferably about 30% to about 50%, of the first thickness d1. Accordingly, about 5% to about 70% of the metal foil 300 may be removed by an etching method.

Figure 7A:
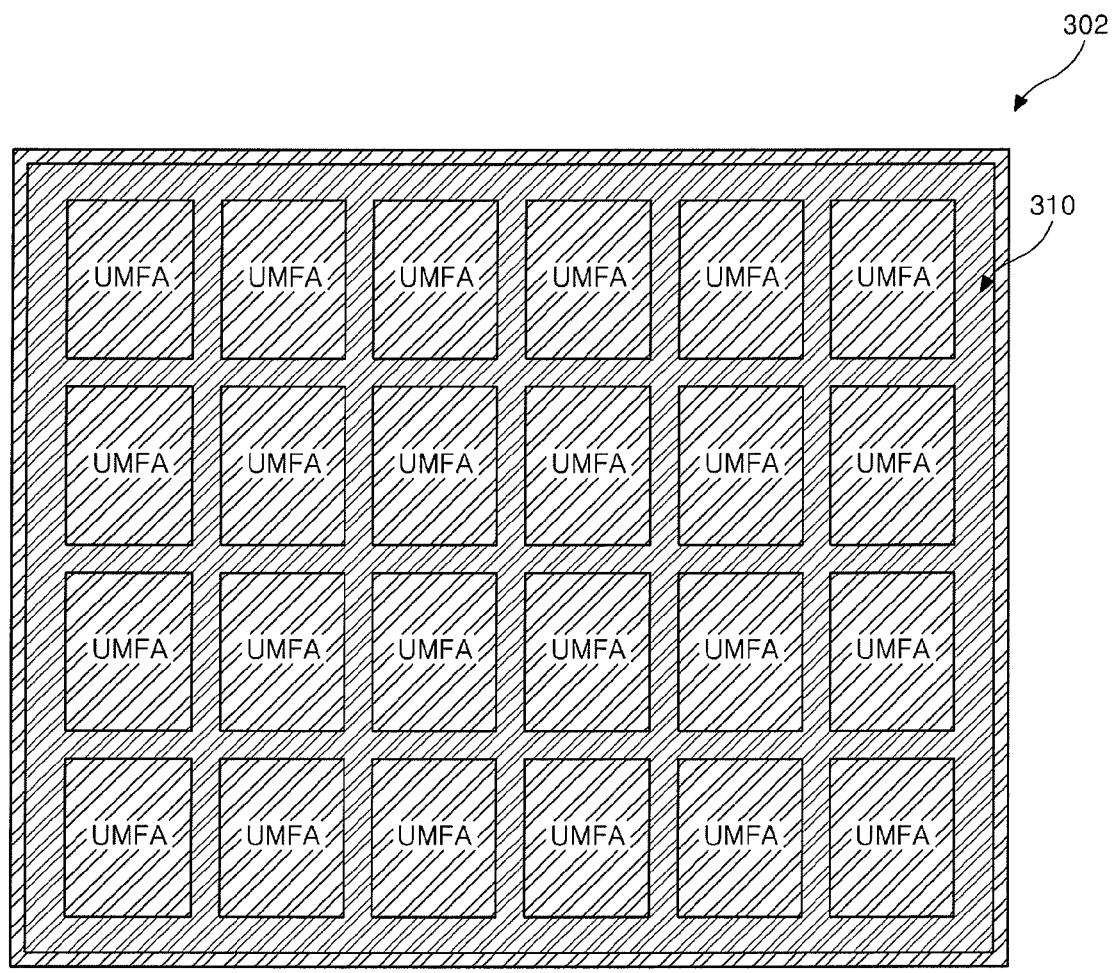
FIGS. 7A and 7B are plan views showing metal foils for organic electroluminescent display device according to second and fifth embodiments, respectively, of the present invention.
Figure 7B:
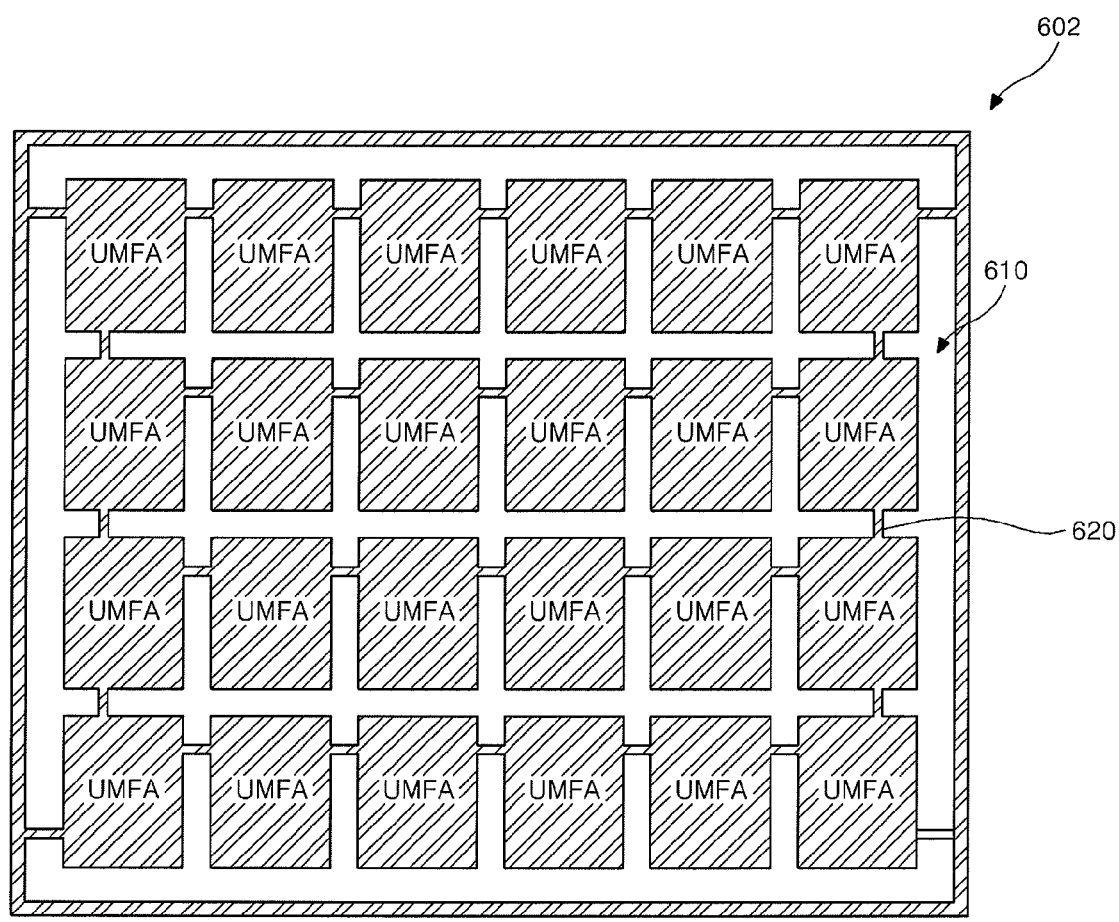

FIGS. 7A and 7B are plan views showing metal foils for organic electroluminescent display device according to second and fifth embodiments, respectively, of the present invention.

In FIG. 7A, a cutting portion 310 is disposed at a border portion between adjacent unit metal foil areas UMFA of a metal foil 302 to have a net shape.

In FIG. 7B, a metal foil 602 includes a plurality of unit metal foil areas UMFA and a cutting portion 610 is formed by removing the metal foil 602 between the adjacent unit metal foil areas UMFA completely except for a connecting portion 620 by an etching method. Accordingly, the plurality of unit metal foil areas UMFA are connected to each other through the connecting portion 620 as a bridge shape. For example, the metal foil 602 may be etched with the plurality of unit metal foil areas UMFA and the connecting portion 620 covered by an etching mask.

Consequently, since a metal foil including a plurality of unit metal foils is attached to a mother substrate including a plurality of array substrates, a supporting substrate for supporting the plurality of unit metal foils and a step of aligning the plurality of unit metal foils to the supporting substrate are not required. Accordingly, the initial investment for production is reduced and the efficiency of fabrication process is improved. In addition, since the adhesive layer covers the entire array substrate including a boundary portion of an organic electroluminescent diode, deterioration such as bending, warpage and distortion is minimized and penetration of contamination source such as moisture and gas is effectively prevented.

It will be apparent to those skilled in the art that various modifications and variations can be made in the organic electroluminescent display device and the method of fabricating the same of the present invention without departing from the sprit or scope of the invention. Thus, it is intended that the present invention covers the modifications and variations of this invention provided they come within the scope of the appended claims and their equivalents.

What is claimed is:

1. A method for fabricating an organic electroluminescent display device, comprising:
   forming a switching thin film transistor, a driving thin film transistor and an organic electroluminescent diode on a mother substrate having a plurality of unit cell areas;
   forming a cutting portion in a metal foil having a plurality of unit metal foil areas, the metal foil having a size corresponding to the mother substrate;
   forming an adhesive layer on the metal foil;
   attaching the mother substrate and the metal foil such that the adhesive layer contacts the mother substrate; and
   cutting the mother substrate and the metal foil along the cutting portion,
   wherein forming the cutting portion in the metal foil comprises removing the metal foil along four sides of each of the plurality of unit metal foil areas between the adjacent unit metal foil areas except for a plurality of connecting portions each connecting the adjacent unit metal foil areas by an etching method.

2. The method according to claim 1, wherein attaching the mother substrate and the metal foil comprises:

disposing the metal foil on a stage of an attaching apparatus;

disposing the mother substrate over the metal foil;

pressurizing the mother substrate such that the organic electroluminescent diode contacts the adhesive layer; and detaching the mother substrate and the metal foil from the stage.

3. The method according to claim 1, wherein the adhesive layer is formed on the second a surface of the metal foil.

4. The method according to claim 1, wherein the adhesive layer covers the entire metal foil including the cutting portion.

5. The method according to claim 1, further comprising:

forming a protecting film on the adhesive layer; and removing the protecting film from the adhesive layer before attaching the mother substrate and the metal foil.

6. The method according to claim 1, wherein the plurality of unit metal foil areas are arranged to have end columns opposite to each other and center columns between the end columns, and wherein one of the plurality of unit metal foil areas in the end columns has three of the plurality of connecting portions and one of the plurality of unit metal foil areas in the center columns has two of the plurality of connecting portions.

* * * * *